(12) United States Patent
Sung et al.

(10) Patent No.: US 9,543,416 B2
(45) Date of Patent: Jan. 10, 2017

(54) METHODS OF FORMING PRODUCTS WITH FINFET SEMICONDUCTOR DEVICES WITHOUT REMOVING FINS IN CERTAIN AREAS OF THE PRODUCT

(71) Applicant: GLOBALFOUNDRIES Inc., Grand Cayman (KY)

(72) Inventors: Min Gyu Sung, Latham, NY (US); Ryan Ryoung-Han Kim, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1 day.

(21) Appl. No.: 14/536,026

(22) Filed: Nov. 7, 2014

(65) Prior Publication Data

US 2016/0133726 A1    May 12, 2016

(51) Int. Cl.
*H01L 21/8234* (2006.01)
*H01L 29/66* (2006.01)
*H01L 29/06* (2006.01)
*H01L 21/308* (2006.01)
*H01L 27/11* (2006.01)

(52) U.S. Cl.
CPC ..... *H01L 29/66795* (2013.01); *H01L 21/3086* (2013.01); *H01L 27/1104* (2013.01); *H01L 29/0642* (2013.01); *H01L 29/6681* (2013.01); *H01L 29/66553* (2013.01)

(58) Field of Classification Search
CPC ............... H01L 21/823431; H01L 21/823821; H01L 21/8234; H01L 21/8238
See application file for complete search history.

(56) References Cited

U.S. PATENT DOCUMENTS

2014/0227857 A1* 8/2014 Youn ................ H01L 21/76229
                                                        438/427

* cited by examiner

*Primary Examiner* — Jae Lee
(74) *Attorney, Agent, or Firm* — Amerson Law Firm, PLLC

(57) ABSTRACT

One illustrative method disclosed herein includes, among other things, forming a first plurality of fins in the first region of the substrate, a second plurality of fins in the second region of the substrate, and a space in the substrate between two adjacent fins in the second region that corresponds to a first isolation region to be formed in the second region, forming a fin removal masking layer above the first and second regions of the substrate, wherein the fin removal masking layer has an opening positioned above at least a portion of at least one of the first plurality of fins, while masking all of the second plurality of fins in the second region and the space for the first isolation region, and performing an etching process through the first opening to remove the portions of the at least one of the first plurality of fins.

14 Claims, 15 Drawing Sheets

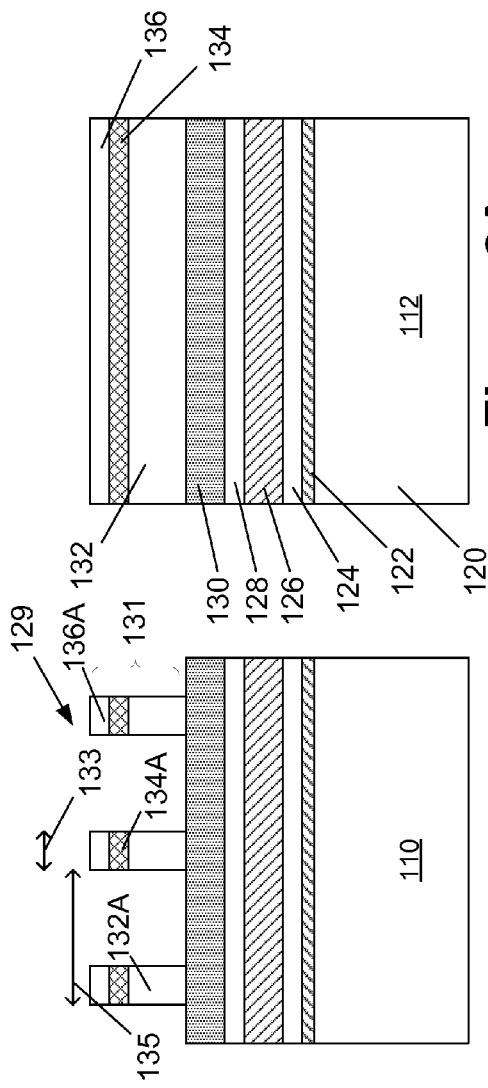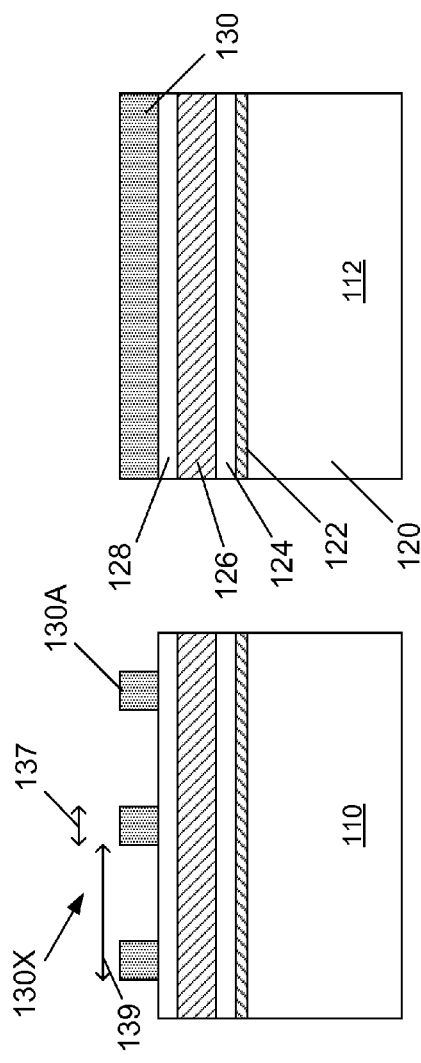

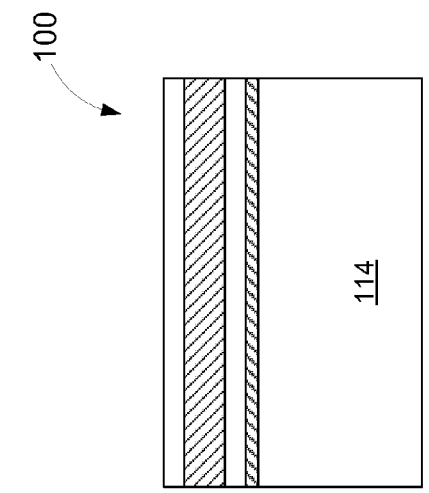
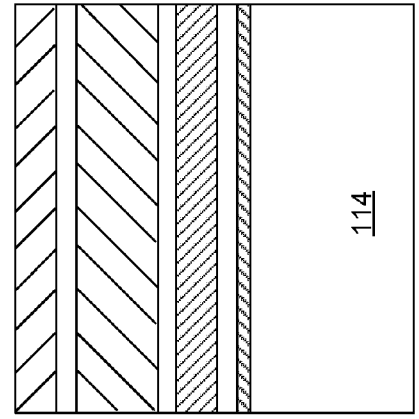
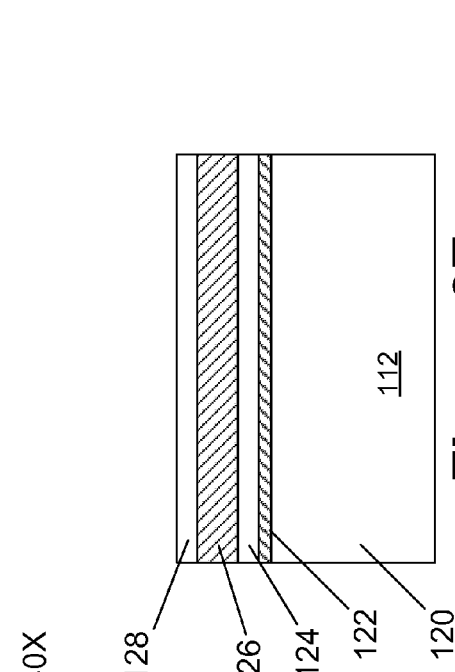
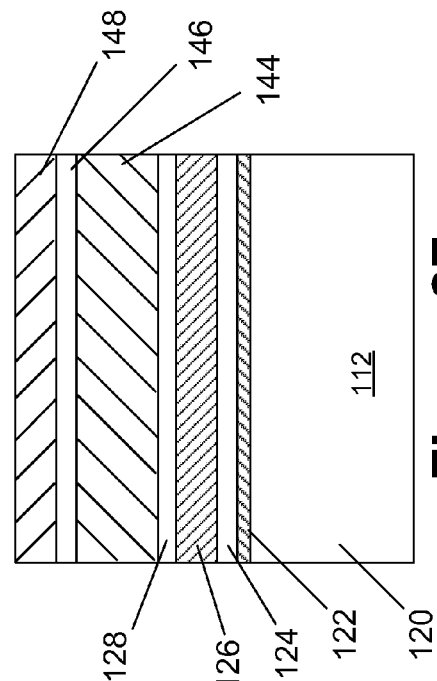
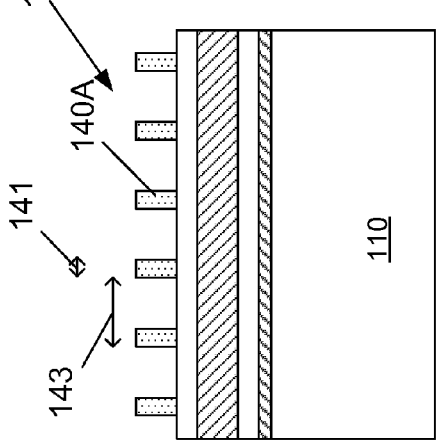
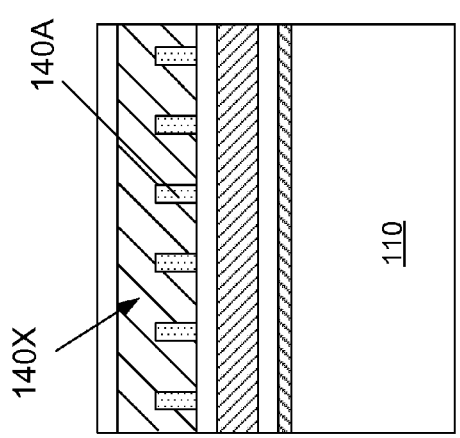
Figure 2E
Figure 2F

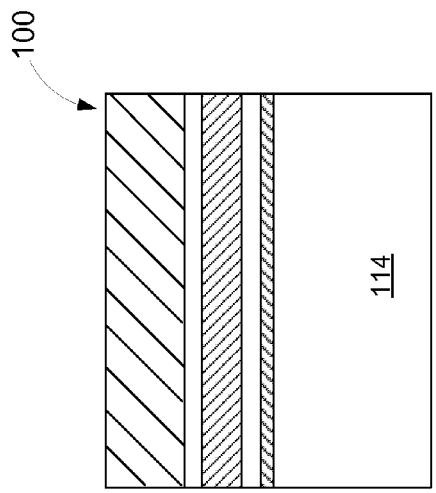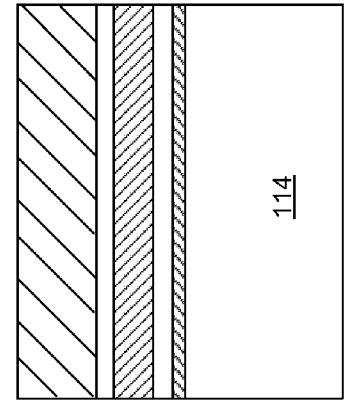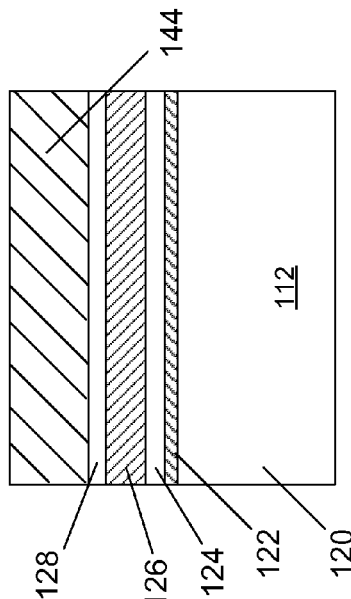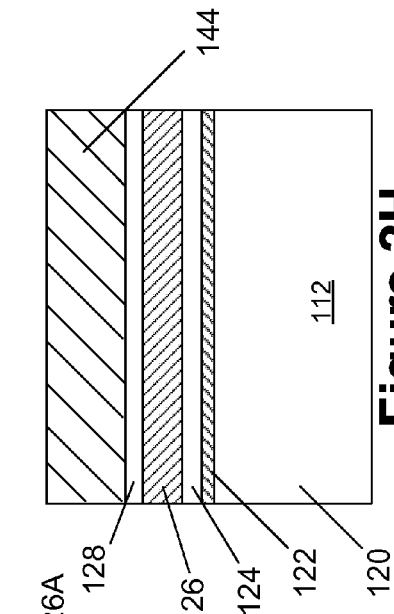
Figure 2G
Figure 2H
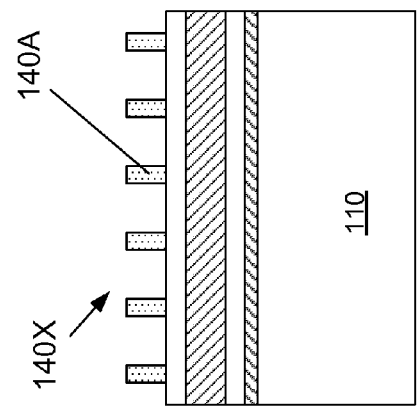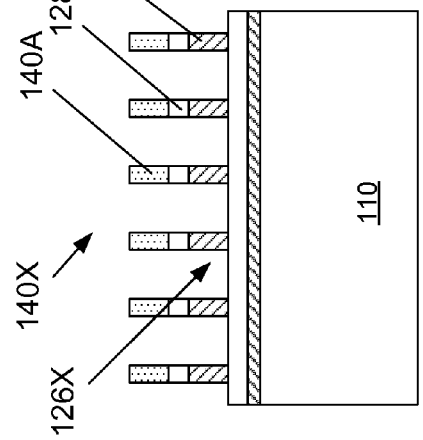

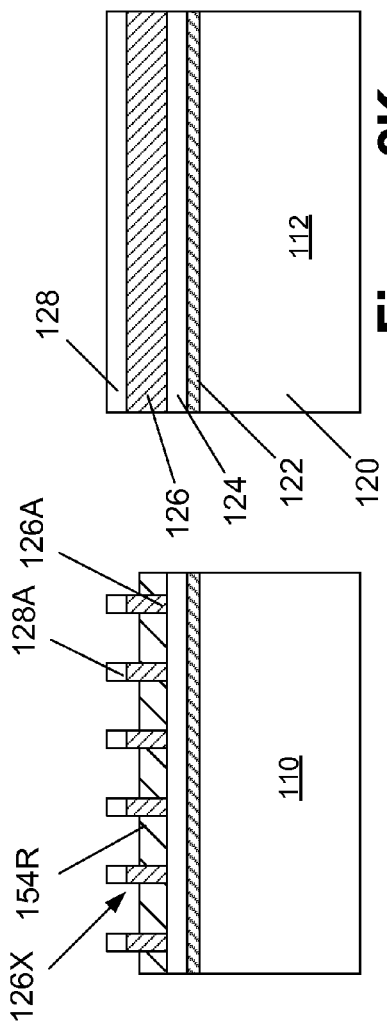
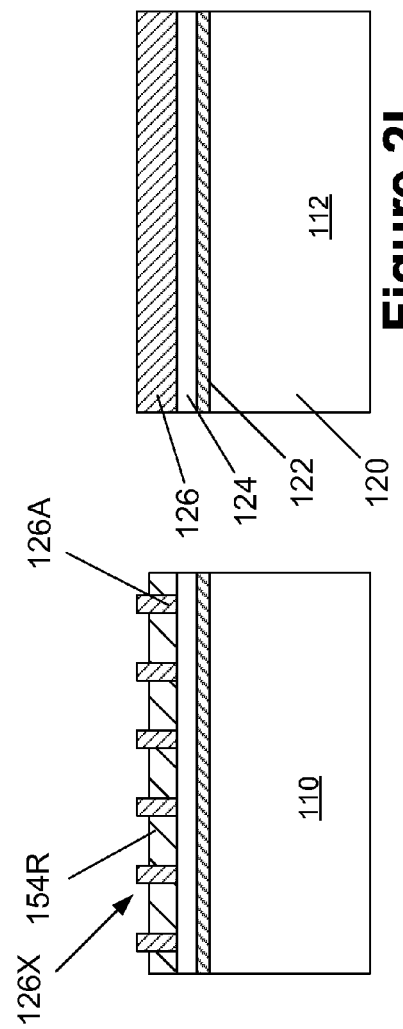
Figure 2K
Figure 2L

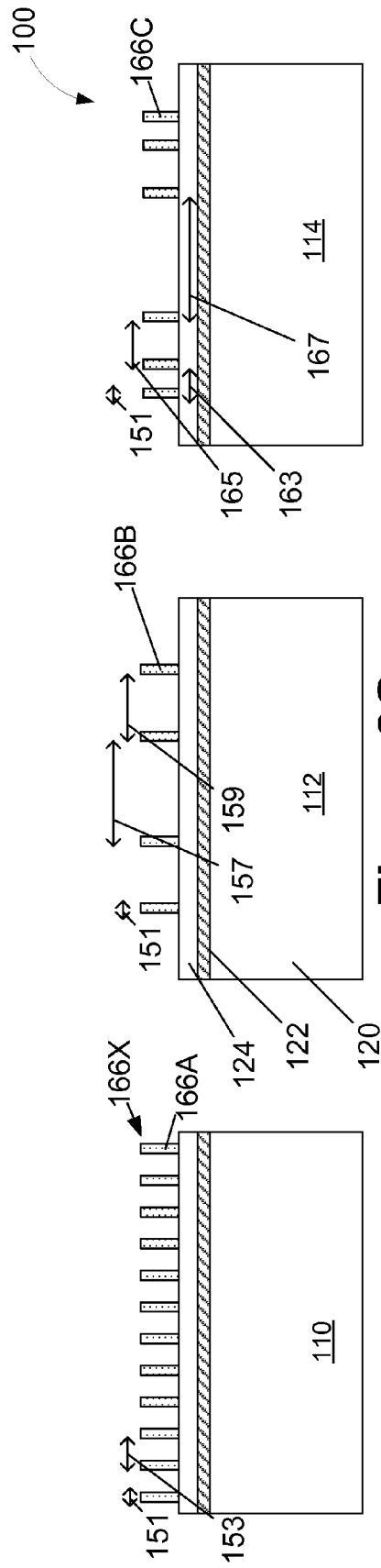
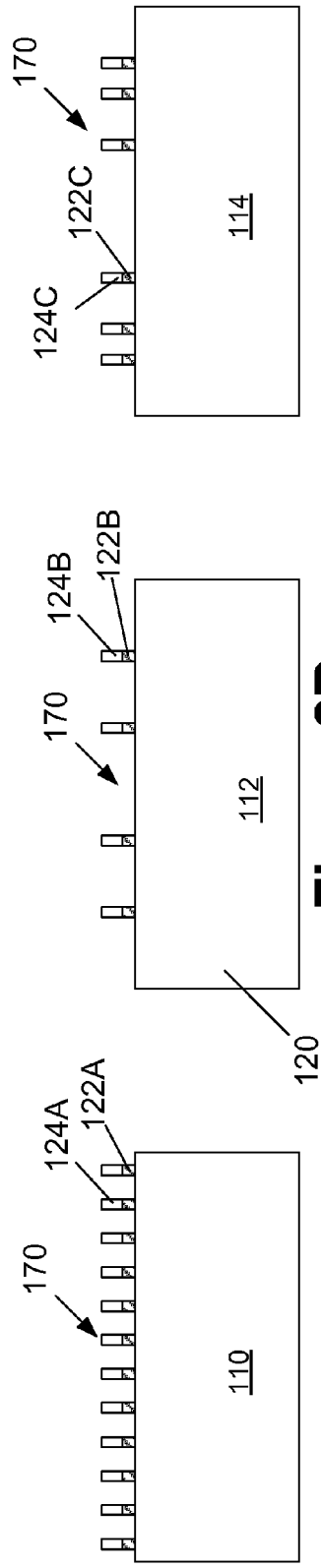

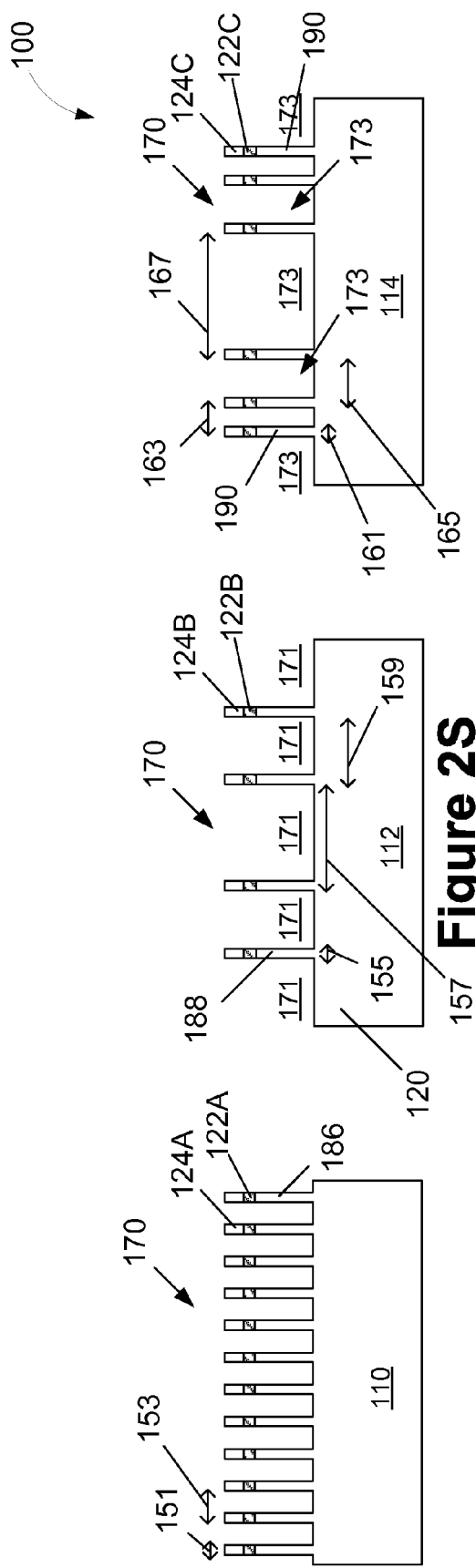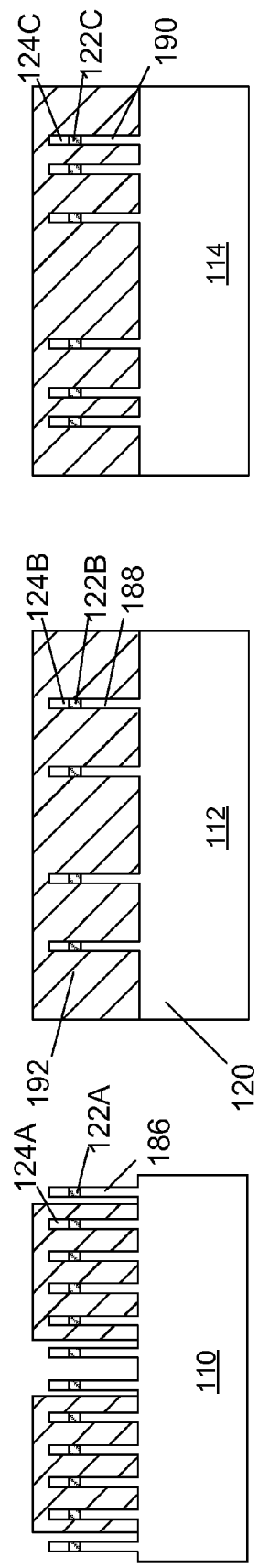

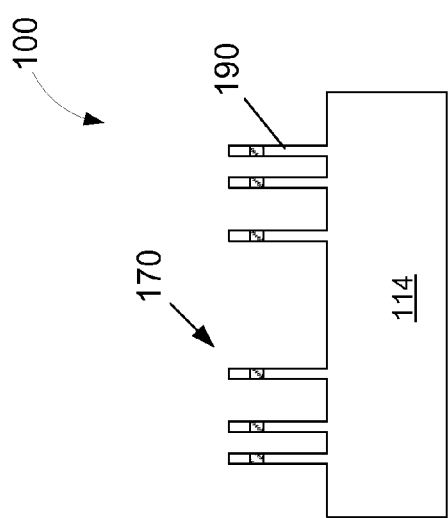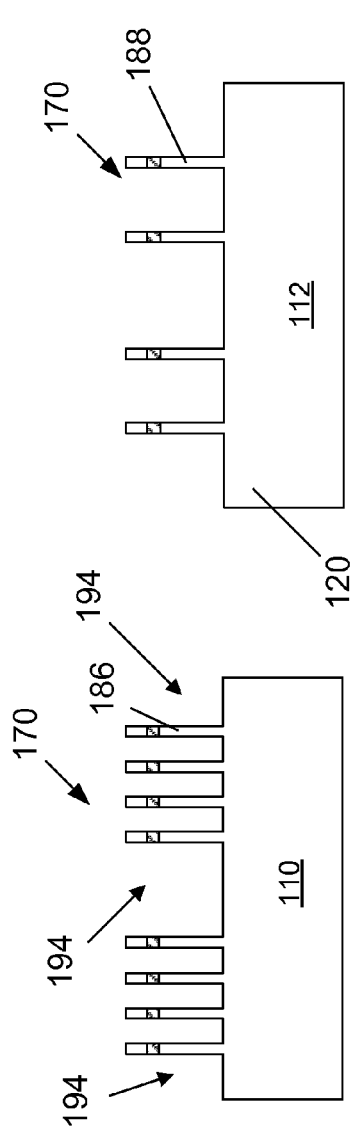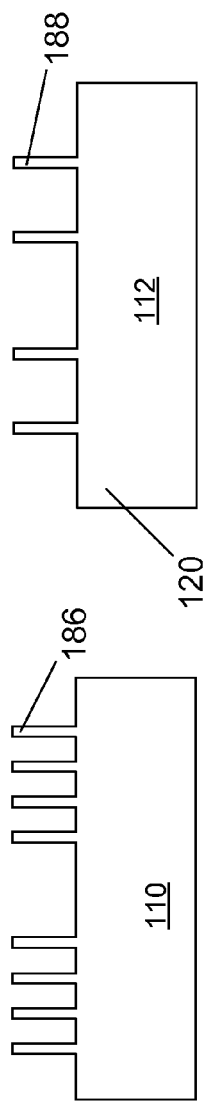
Figure 2U
Figure 2V

METHODS OF FORMING PRODUCTS WITH FINFET SEMICONDUCTOR DEVICES WITHOUT REMOVING FINS IN CERTAIN AREAS OF THE PRODUCT

BACKGROUND OF THE INVENTION

1. Field of the Invention

Generally, the present disclosure relates to the manufacture of semiconductor devices, and, more specifically, to various methods of forming integrated circuit products that include FinFET semiconductor devices without removing fins in certain areas of the product.

2. Description of the Related Art

In modern integrated circuits, such as microprocessors, storage devices and the like, a very large number of circuit elements, especially field effect transistors (FETs), are provided and operated on a restricted chip area. Such field effect transistors (both NFETs and PFETs) operate in a switched mode, that is, these transistor devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

FETs come in a variety of configurations, e.g., planar devices, nanowire devices, FinFET devices, etc. A planar transistor device is normally manufactured in an active region of a substrate having a substantially planar upper surface. In contrast to a planar FET, a so-called FinFET device has a three-dimensional (3D) structure. FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. Trenches T are formed in the substrate B to define the fins C. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The regions of the fins C covered by the gate structure D are the channel regions of the FinFET device A. In a conventional process flow, the regions of the fins C that are positioned outside of the spacers E are the source/drain regions of the device A. Unlike a planar FET, in a FinFET device, a channel is formed perpendicular to a surface of the semiconducting substrate so as to reduce the physical size of the semiconductor device.

Both planar and FinFET semiconductor devices are typically electrically isolated from adjacent transistor devices so that they can perform their intended function. This is typically accomplished by forming an isolation structure, e.g., a shallow trench isolation structure, in the semiconducting substrate around the transistor device. Traditionally, isolation structures were typically the first structure that was formed when manufacturing semiconductor devices. The isolation structures were formed by etching the trenches into the substrate for the isolation structures, and thereafter filling the trenches with the desired insulating material, e.g., silicon dioxide. After the isolation structures were formed, various process operations were performed to manufacture the transistor devices.

In the case of FinFET devices, these process operations involved masking the previously formed isolation structure, and thereafter etching the trenches into the substrate that defined the fins. However, as the dimensions of the fins became smaller, problems arose with manufacturing the isolation structures before the fins were formed. As one example, trying to accurately define very small fins in regions that were separated by relatively large isolation regions was difficult due to the non-uniform spacing between various structures on the substrate. One manufacturing technique that is employed in manufacturing FinFET devices is to initially form a plurality of "fins" that extend across the entire substrate, i.e., sometimes referred to as a "sea of fins," and thereafter remove some of the fins where larger isolation structures will be formed. Using this type of manufacturing approach, better accuracy and repeatability may be achieved in forming the fins to very small dimensions due to the more uniform environment in which the etching process that forms the trenches is performed.

There are two commonly employed techniques for accomplishing the goal of removing the desired number of fins (or regions thereof). One such removal process is typically referred to as "Fins-cut-First." In this process, one or more features of a patterned masking layer that is formed above the initial substrate is selectively exposed and removed prior to performing a fin formation etching process through the patterned masking layer. As a result, in the region where the masking feature(s) was removed from the patterned masking layer, the substrate is etched to define a wider trench that is free of any fin structures. This wider trench is then filled with an insulating material, e.g., silicon dioxide.

Another fin removal process is typically referred to as "Fins-cut-Last." In this process, a patterned masking layer with features corresponding to the desired sea-of-fins is formed above the initial surface of the substrate. Thereafter, a fin-formation etching process is performed through the patterned masking layer to form the trenches across the entire substrate and thereby define the sea-of-fins. Next, the regions of the sea-of-fins that are to be removed are exposed by another patterned masking layer and removed by performing an etching process. This defines a larger trench that is free of fin structures. The larger trench is then filled with an insulating material, such as silicon dioxide.

FIG. 1B depicts a problem that may arise when using a Fins-cut-Last fin removal process when trying to remove only a single fin so as to form a desired isolation structure between adjacent FinFET devices. FIG. 1B depicts a device 10 at a point in fabrication wherein a plurality of trenches 17 were etched into a substrate 12 so as to define a plurality of fins 13. The etching process was performed through a patterned etch mask 14. FIG. 1B also depicts the device 10 after a layer of insulating material 19 was deposited into the trenches 17, and after a CMP process was performed using the patterned etch mask 14 as a polish-stop layer. In the example depicted in FIG. 1B, it is desired to remove only the single fin 15 so as to form a region of an isolation region (not shown) in its place after removal. A patterned masking layer 22, e.g., a patterned layer of photoresist, with an opening 22A is formed on the device 10.

In earlier generation devices, the dimensions of the fins 13 and the width of the trenches 17 were such that one or more etching processes could be performed though the opening 22A to remove the single fin 15. However, device dimensions have continued to shrink, e.g., the lateral width of the fins 13 may be on the order of about 10 nm or less, and the width of the trenches 17 may be on the order of about 20 nm or less. Accordingly, the size 18 of the opening 22A that is needed to remove only the single fin 15 is so small, e.g., 30 nm or less, that an opening 22A with the desired smaller size 18 cannot be formed using a single patterned photoresist masking layer, such as the patterned photoresist layer 22. One possible solution would be to use more complex and expensive double patterning techniques to define a patterned masking layer (typically a hard mask layer) with an opening having the desired size 18. Another possible solution would be to simply increase the number of fins being removed from say one to three, thereby making the size of the opening 18 one that can be formed using a single patterned photoresist masking layer. However, this latter approach would result in undesirable consumption of extremely valuable plot space on the substrate, and be counter to the desire by all integrated circuit manufacturers to increase packing densities and reduce the physical size of the overall final integrated circuit product. The problems discussed above apply equally to the so-called "Fins-cut-First" fin removal process.

The present disclosure is directed to various methods of forming integrated circuit products that include FinFET semiconductor devices without removing fins in certain areas of the product that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming integrated circuit products that include FinFET semiconductor devices without removing fins in certain areas of the product. One illustrative method disclosed herein includes, among other things, performing a fin-formation etching process through a patterned fin-formation masking layer positioned above first and second regions of a semiconductor substrate to define a first plurality of fins in the first region of the substrate, a second plurality of fins in the second region of the substrate, and a space in the substrate between two adjacent fins in the second region that corresponds to a first isolation region to be formed in the second region, forming a fin removal masking layer above the first and second regions of the substrate, a first portion of the fin removal masking layer being positioned above the first region, the first portion of the fin removal masking layer comprising at least one first opening positioned above at least a portion of at least one of the first plurality of fins, the fin removal masking layer masking all of the second plurality of fins in the second region and the space for the first isolation region, and performing at least one etching process through the at last one first opening in the fin removal masking layer to remove the portions of the at least one of the first plurality of fins underlying the at least one first opening while masking all of the second plurality of fins in the second region.

BRIEF DESCRIPTION OF THE DRAWINGS

The disclosure may be understood by reference to the following description taken in conjunction with the accompanying drawings, in which like reference numerals identify like elements, and in which.

Figure 1A:
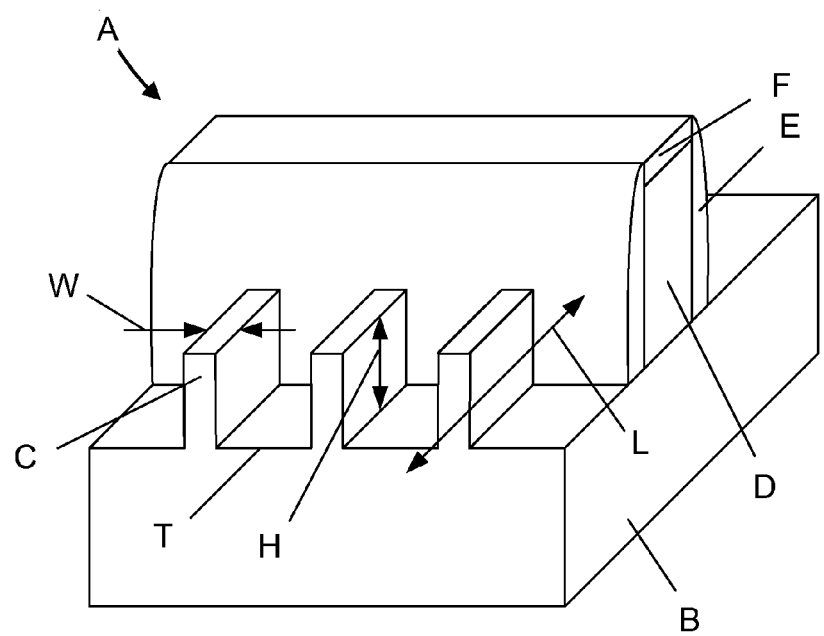
FIG. 1A is a perspective view of one illustrative embodiment of a prior art FinFET device.
Figure 1B:
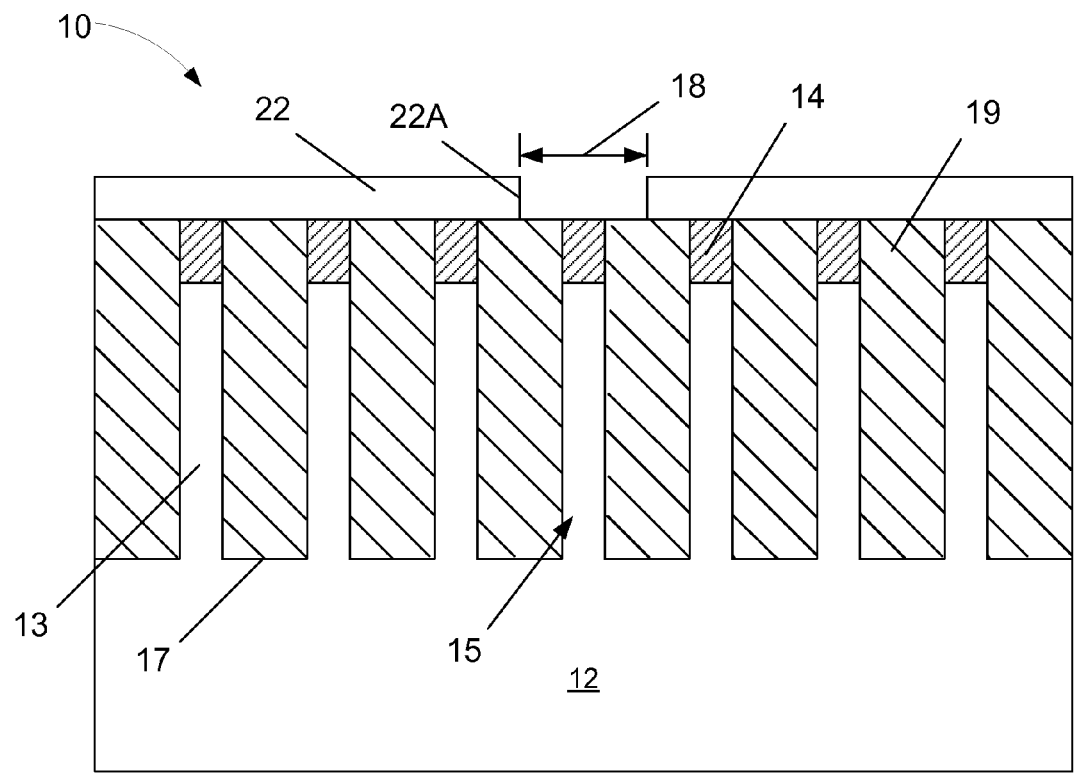
FIG. 1B is a cross-sectional view of one illustrative embodiment of a prior art FinFET device that is provided so as to explain problems that may be encountered when trying to remove a single fin structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various methods are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming integrated circuit products that include FinFET semiconductor devices without removing fins in certain areas of the product. The methods disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Of course, the inventions disclosed herein should not be considered limited to the illustrative examples depicted and described herein.

As will be recognized by those skilled in the art after a complete reading of the present application, the illustrative integrated circuit product 100 described herein may be comprised of either N-type FinFET devices, P-type FinFET devices or both types of devices (CMOS application). The product 100 will be formed in and above an illustrative semiconductor substrate 120. In this illustrative embodiment, the substrate 120 has a bulk semiconducting material configuration. The substrate 120 may be made of silicon or it may be made of materials other than silicon. Thus, the terms "substrate" or "semiconducting substrate" should be understood to cover all forms of all semiconductor materials.

In general, the methods will be disclosed in the context of forming different types of devices, e.g., logic devices, different types of SRAM devices (e.g., SRAM 1-1-1, SRAM 1-2-2) in different regions of the substrate 120. An SRAM 1-1-1 device includes one NFET transistor that acts as a pull-down transistor, one PFET transistor that acts as a pull-up transistor and one NFET device that functions as a pass-gate transistor. An SRAM 1-2-2 device includes one PFET transistor that acts as a pull-down transistor, two NFET transistors that act as pull-up transistors and two NFET devices that function as pass-gate transistors. Accordingly, FIG. 2A depicts a first region 110, a second region 112 and a third region 114 of the substrate 120 at an early stage of manufacturing after various deposition processes and patterning processes have been performed. Each of the regions 110, 112, 114 is a contiguous part of the same substrate 120. The regions 110, 112, 114 may be positioned adjacent one another or they may be spaced apart from one another on the substrate 120, and the regions 110, 112, 114 may vary in physical size, and the number of devices formed in each region may also vary. As noted above, each of the regions 110, 112, 114 may have different types of devices formed therein. For example, the first region 110 of the substrate 120 may be used to form FinFET devices for logic circuits, the second region 112 may be used to form FinFET devices for a first type of SRAM devices, and the third region 114 may be used to form FinFET devices for a second type of SRAM devices. Of course, the devices that are formed in each of the regions may vary depending upon the application.

With continuing reference to FIG. 2A, several process operations have been performed on the integrated circuit product 100. First, a pad layer 122, a lower hard mask layer 124, a lower mandrel layer 126, an upper hard mask layer 128 and an upper mandrel layer 130 were sequentially formed above the substrate 120. Thereafter various material layers 132, 134 and 136 that will collectively be used to form or be part of a patterned mask layer 129 above the first region 110 were formed above the upper mandrel layer 130. In one embodiment, the layer 132 may be an OPL layer, the layer 134 may be an anti-reflective coating (ARC) layer and the layer 136 may be a photoresist material. FIG. 2A depicts the product 100 after the photoresist layer 136 and the ARC layer 134 were initially patterned above only the first region 110 using traditional photolithography techniques, and after an etching process was performed through the patterned layers 136, 134 so as to thereby define the patterned masking layer 129 comprised of features 131, that includes the patterned OPL layer 132A. This etching process stops on the upper mandrel layer 130 in the first region 110. The features 131 (i.e., the remaining regions 132A, 134A, 136A) of the patterned masking layer 129 have a lateral width 133 and a pitch 135 (not illustrated to scale). In at least one illustrative embodiment, the width 133 may be approximately 40 nm and the pitch 135 may be approximately 120 nm. Of course, the width and pitch dimensions may vary depending upon the application.

The layers of material depicted in FIG. 2A may be made of various materials depending upon the particular application. For example, in at least one illustrative embodiment, the pad layer 122 may be made of silicon dioxide, the hard mask layers 124, 128 may be made of silicon nitride and the mandrel layers 126, 130 may be made of amorphous silicon. The ARC layer 124 may be made of a variety of materials in various embodiments, such as silicon nitride, silicon oxynitride, silicon or carbon-containing organic polymers, etc., depending upon the application. The various layers shown in FIG. 2A may be deposited in various thicknesses depending upon the application. For example, in at least one illustrative embodiment, the hard mask layers 124, 128 may each be about 30 nm thick, the mandrel layers 126, 130 may each be about 100 nm thick, the OPL layer 132 may be about 100 nm thick and the ARC layer may be about 35 nm thick. The layers of material depicted in FIG. 2A may be formed by performing any of a variety of known processing techniques, e.g., chemical vapor deposition (CVD), atomic layer deposition (ALD), physical vapor deposition (PVD), spin-coating, etc.

FIG. 2B depicts the product 100 after several process operations were performed. First, in one embodiment, the layers 136 and 134 may be removed leaving only the patterned OPL layer 132 as the patterned masking layer 129. In other cases, the layers 136 and 134 may remain as part of the patterned masking layer 129. Irrespective of the number of layers of material in the patterned masking layer 129, FIG. 2B depicts the product 100 after one or more anisotropic etching processes were performed through the patterned masking layer 129 to pattern the upper mandrel layer 130 relative to the surrounding materials and define a patterned upper mandrel layer 130X comprised of upper mandrel structures or features 130A above the first region 110 only of the product 100. At least the remaining portions of the OPL layer 132 positioned above the second and third regions 112, 114 protect the upper mandrel layer 130 above the second 112 and third 114 regions of the substrate 120 from the etching processes. In at least one illustrative embodiment, features of the upper mandrel structures 130A have a lateral width 137 and a pitch 139, which may be approximately 40 nm and 120 nm respectively. After the patterned upper mandrel layer 130X is formed only above the first region 110, the materials positioned above the upper mandrel layer 130 and the patterned upper mandrel layer 130X are removed from all three regions 110, 112 and 114 of the substrate 120.

Figure 2C:
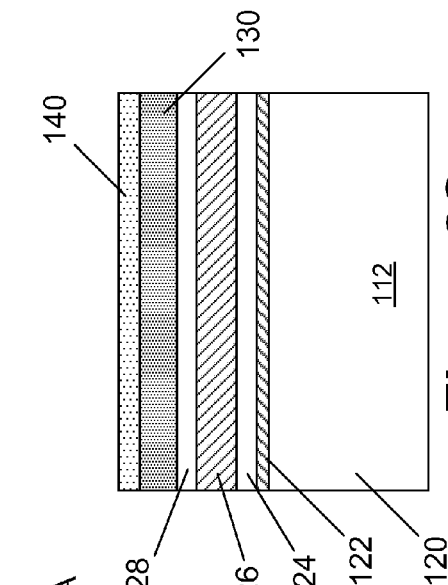
FIGS. 2A-2Y depict various illustrative methods disclosed herein for forming fins for FinFET semiconductor devices.
Figure 2C:
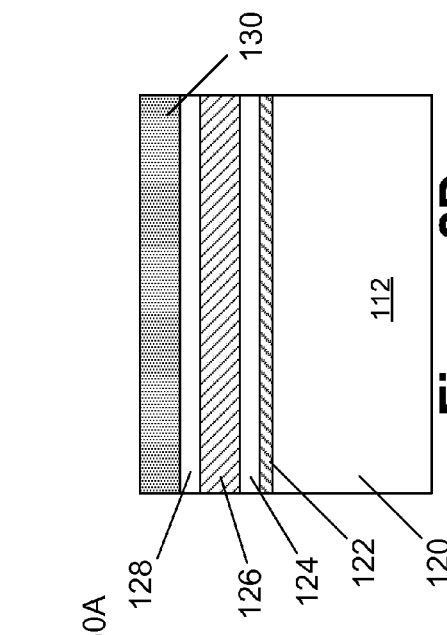

FIG. 2C depicts the product 100 after a layer of spacer material 140 was deposited above the substrate 120. In at least one illustrative embodiment, the layer of spacer material 140 may be approximately 20 nm thick and it may be made of silicon dioxide. The thickness and material of the layer of spacer material 140 may vary depending upon the application.

Figure 2D:
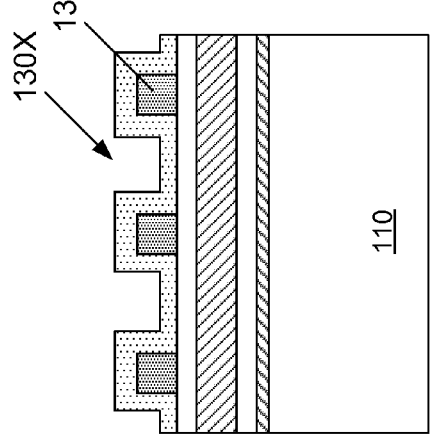
Figure 2D:
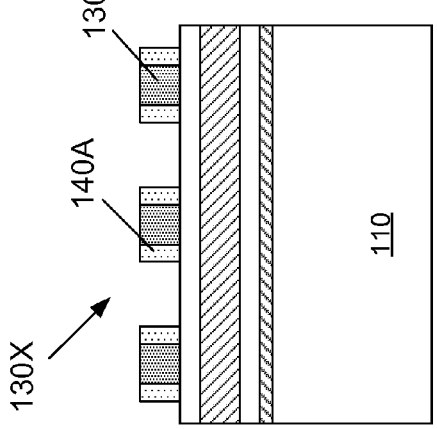

FIG. 2D depicts the product 100 after an anisotropic etching process was performed on the layer of spacer material 140 above all three regions 110, 112, 114 of the substrate 120 to remove horizontally positioned portions of the layer of spacer material 140. This results in the formation of sidewall spacer structures 140A positioned adjacent to the upper mandrel structures 130A of the patterned upper mandrel layer 130X above the first region 110 of the substrate 120. The regions 112 and 114 are substantially cleared of the layer of spacer material 140.

FIG. 2E illustrates the product 100 after an etching process was performed to remove the upper mandrel layer 130, including the upper mandrel structures 130A of the patterned upper mandrel layer 130X, from all three regions of the substrate 120 relative to the surrounding materials. This operation results in a first patterned spacer masking layer 140X that is positioned only above the first region 110 of the substrate 120. In at least one illustrative embodiment, sidewall structures 140A of the first patterned spacer masking layer 140X have a lateral width 141 and a pitch 143, which may be approximately 20 nm and 60 nm, respectively.

FIG. 2F depicts the product 100 after several process operations were performed. First, a masking layer 144, such as OPL, and an ARC layer 146 were formed across all three regions 110, 112 and 114 of the substrate 120. Thereafter, a patterned layer of photoresist material 148 was formed on the product 100. As depicted, the patterned layer of photoresist material 148 covers the second and third regions 112, 114, while leaving the first region 110 exposed.

FIG. 2G depicts the product 100 after several process operations were performed. First, with the patterned photoresist mask 148 (FIG. 2F) in position above the first and third regions 112, 114, the ARC layer 146 and the OPL layer 144 were selectively removed from above only the first region 110 of the substrate 120. This exposes the patterned spacer masking layer 140X. Next, the patterned photoresist mask 148 and ARC layer 146 were removed from above the second 112 and third 114 regions of the substrate 120. These operations leave the remaining portions of the OPL layer 144 positioned above the second and third regions 112, 114, but the first region 110 is cleared of the OPL layer 144, thereby exposing the first patterned spacer masking layer 140X.

FIG. 2H depicts the product 100 after one or more anisotropic etching processes were performed through the first patterned spacer masking layer 140X to remove the exposed portions of the upper hard mask layer 128 and the lower mandrel layer 126 to transfer the pattern of the features 140A (with width 141 and pitch 143 (FIG. 2E)) in the first patterned spacer masking layer 140X to the lower mandrel layer 126 above the first region 110 of the substrate 120. This process operation results in the formation of a patterned lower mandrel layer 126X comprised of lower mandrel features 126A. During this etching process, the OPL layer 144 above the second and third regions 112, 114 protects the upper hard mask layer 128 and the lower mandrel layer 126 in those regions from the etching processes.

Figure 2I:
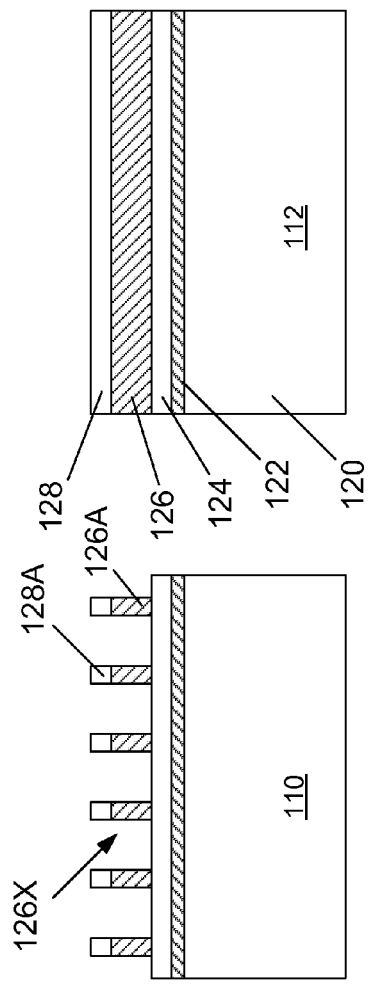
Figure 2I:
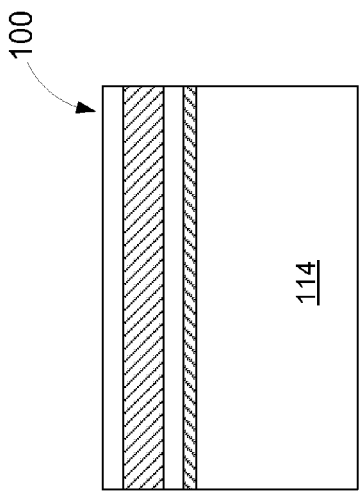

FIG. 2I depicts the product 100 after layers above the upper hard mask layer 128 were removed, i.e., after the OPL layer 144 was removed (from above regions 112 and 114) and after the first patterned spacer masking layer 140X was removed (from above the region 110). These materials may be removed in any desired order. These process operations make the upper hard mask layer 128 the uppermost layer of material on the product 100 at this point in the process flow (patterned in the first region 110 and un-patterned in the regions 112, 114).

Figure 2J:
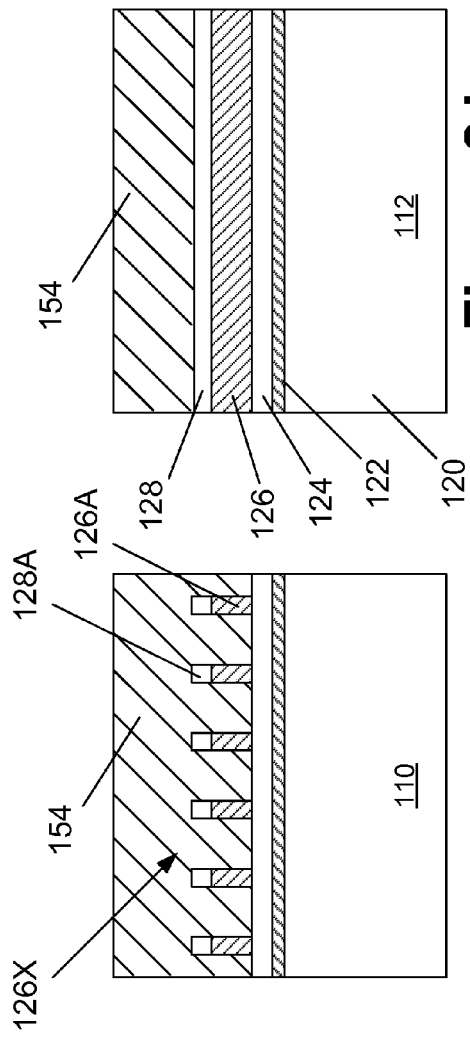
Figure 2J:
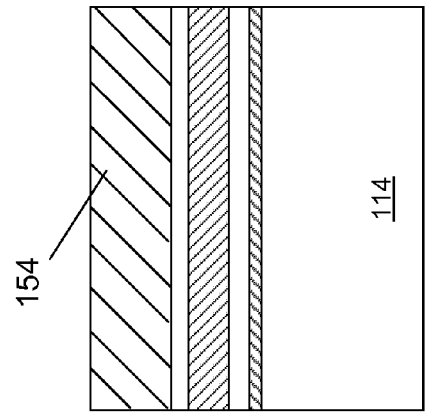

FIG. 2J depicts the product 100 after another protective layer 154, e.g., an OPL layer, was formed above all three regions 110, 112, 114 above the substrate 120. The thickness of the protective layer 154 may vary depending upon the application.

FIG. 2K depicts the product 100 after a timed, recess etching process was performed for a sufficient duration so as to remove substantially all of the protective layer 154 from above the second and third regions 112, 114, while leaving a recessed protective layer 154R positioned above the first region 110. The removal of the protective layer 154 from above the second and third regions 112, 114 exposes the upper hard mask layer 128 in the second and third regions 112, 114. More specifically, the recess etching process is performed for a sufficient duration such that the upper hard mask layer 128 (with features 128A) is positioned above the upper surface of the recessed protective layer 154R in the first region 110 of the substrate 120. The final height of the recessed protective layer 154R may vary depending upon the application, i.e., the exposed height of the features 126A of the patterned lower mandrel layer 126X may vary depending upon the particular application.

FIG. 2L depicts the product 100 after an etching process was performed to remove the upper hard mask layer 128 (including the features 128A) relative to the surrounding materials above all three regions 110, 112, 114 of the substrate 120. The recessed protective layer 154R protects the lower hard mask layer 124 above the first region 110 of the substrate 120 from the etching process, while the layer 126 protects the layer 124 in the second and third regions 112, 114.

Figure 2M:
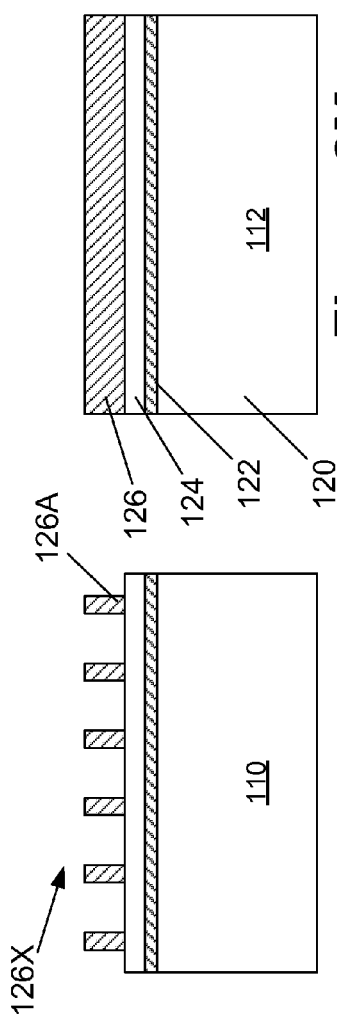
Figure 2M:
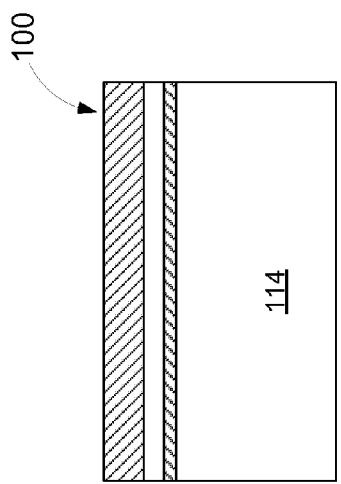

FIG. 2M depicts the product 100 after an etching process was performed to remove the recessed protective layer 154R from above the first region 110 of the substrate 120.

Figure 2N:
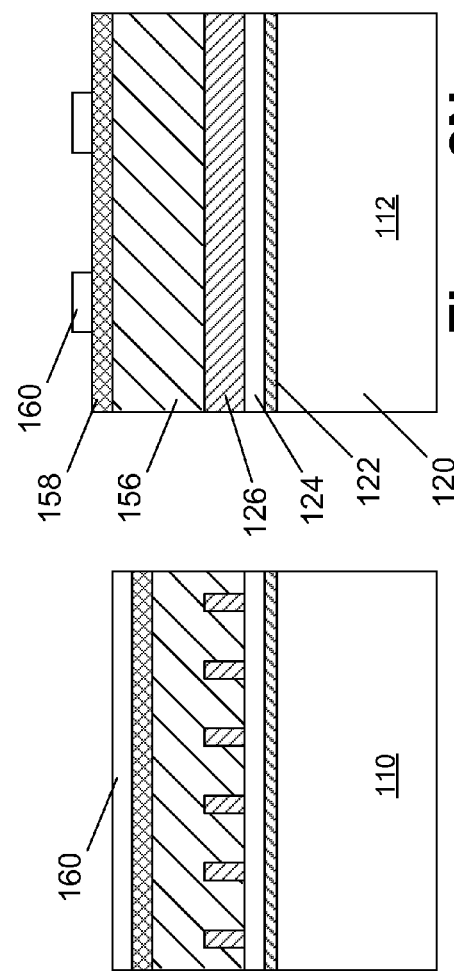
Figure 2N:
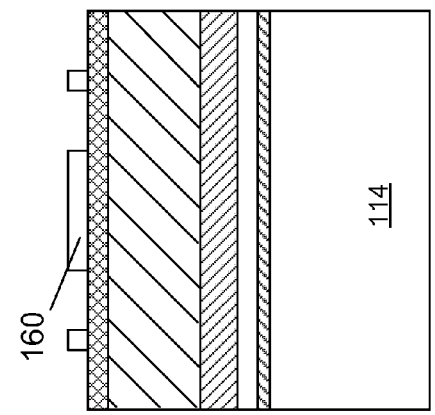

FIG. 2N depicts the product 100 after several process operations were performed. First, a masking layer 156, such as OPL, and an ARC layer 158 were formed across all three regions 110, 112 and 114 of the substrate 120. Thereafter, a patterned layer of photoresist material 160 was formed on the product 100. As depicted, the patterned layer of photoresist material 160 covers the first region 110 and is patterned above the second and third regions 112, 114, thereby leaving portions of the second and third regions 112, 114 exposed.

Figure 2O:
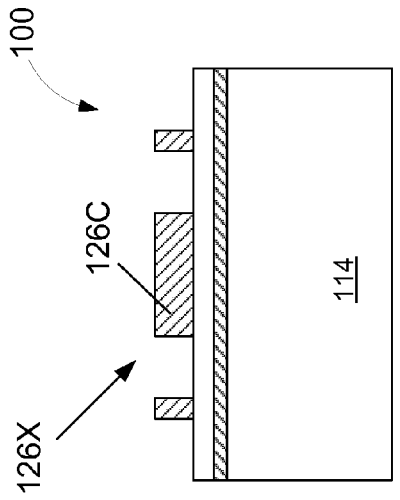
Figure 2O:
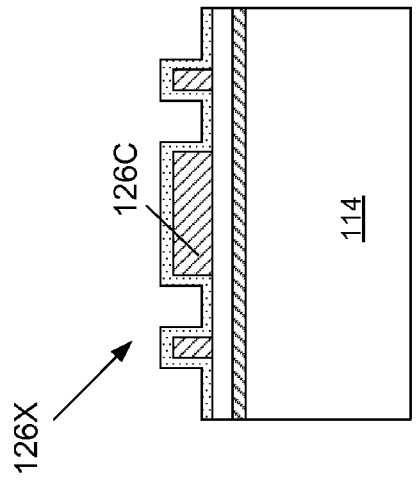

FIG. 2O depicts the product 100 after several process operations were performed. First, one or more anisotropic etching processes were performed to etch the lower mandrel layer 126 in the second and third regions 112, 114 using the patterned masking layer 160 positioned above the second and third regions 112, 114 as an etch mask, while the first region 110 remains protected by the masking layer 160. Thereafter, the patterned masking layer 160, ARC layer 158, and protective layer 156 were removed from above all three regions 110, 112, and 114 of the substrate 120. As a result of these operations, two additional sets of lower mandrel structures 126B, 126C were defined. In total, the patterned lower mandrel layer 126X depicted in FIG. 2O is comprised of features 126A (above the first region 110), the features 126B (above the second region 112) and the features 126C (above the third region 114).

Figure 2P:
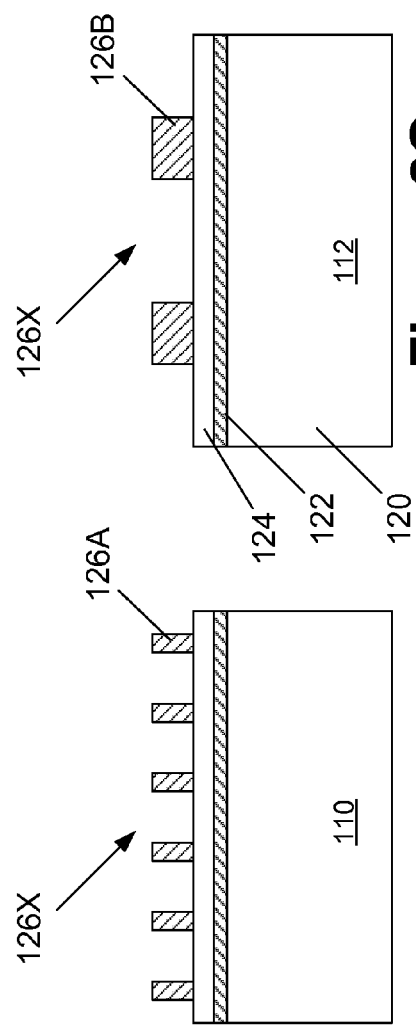
Figure 2P:
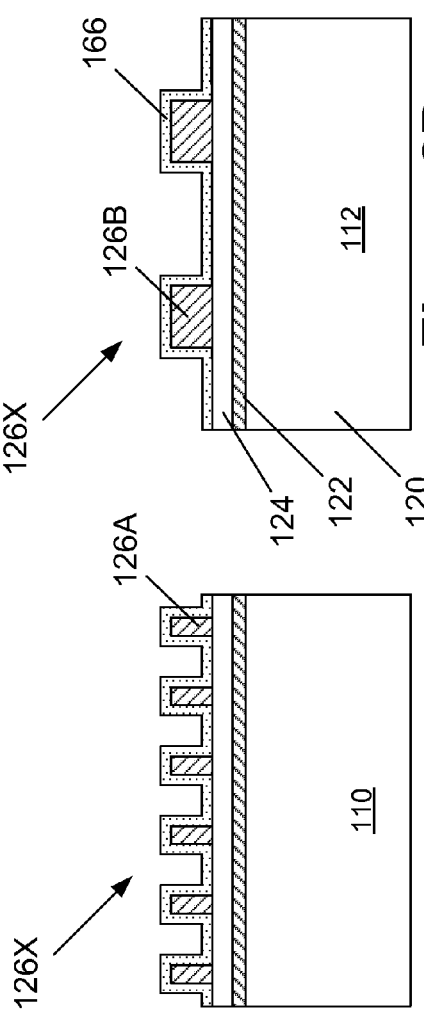

FIG. 2P depicts the product 100 after another layer of spacer material 166 was deposited above the substrate 120 and the patterned lower mandrel layer 126X. In at least one illustrative embodiment, the layer of spacer material 166 may be approximately 15 nm thick and it may be made of silicon dioxide. The thickness and material of the layer of spacer material 166 may vary depending upon the application.

FIG. 2Q depicts the product 100 after several process operations were performed. First, an anisotropic etching process was performed on the layer of spacer material 166 above all three regions 110, 112, 114 of the substrate 120. This results in the formation of sidewall spacer structures 166A positioned adjacent to the features 126A, 126B and 126C of the patterned lower mandrel layer 126X. Next, a selective etching process was performed to remove the patterned lower mandrel layer 126X (i.e., the lower mandrel structures 126A, 126B, 126C) relative to the surrounding materials and the sidewall spacers 166A, 166B and 166C. This results in the definition of a second sidewall spacer mask 166X comprised of features 166A, 166B and 166C positioned above the regions 110, 112 and 114, respectively. The sidewall spacer structures 166A, 166B, 166C have a lateral width 151 that may be the same in all three regions 110, 112 and 114. However, the pitch of the features of the second sidewall spacer mask 166X are different within each of the regions 110, 112 and 114. In one embodiment, the pitch 153 in the first region 110 is substantially uniform, the features 166B in the second region 112 have two different pitches 157, 159 and the features 166C in the third region 114 have three different pitches 163, 165, 167. As indicated above, the width 151 may vary depending upon the application, as may the pitches 153, 157, 159, 163, 165 and 167.

Next, as shown in FIG. 2R, one or more etching processes were performed through the second sidewall spacer mask 166X to transfer the features in the second sidewall spacer mask 166X to the lower hard mask layer 124 and pad layer 122. Thereafter, the second sidewall spacer mask 166X was selectively removed relative to the surrounding materials. These process operations result in the definition of a final fin formation patterned etch mask 170 comprised of features 124A/122A (above the first region 110), the features 124B/122B (above the second region 112) and the features 124C/122C (above the third region 114).

Figure 2W:
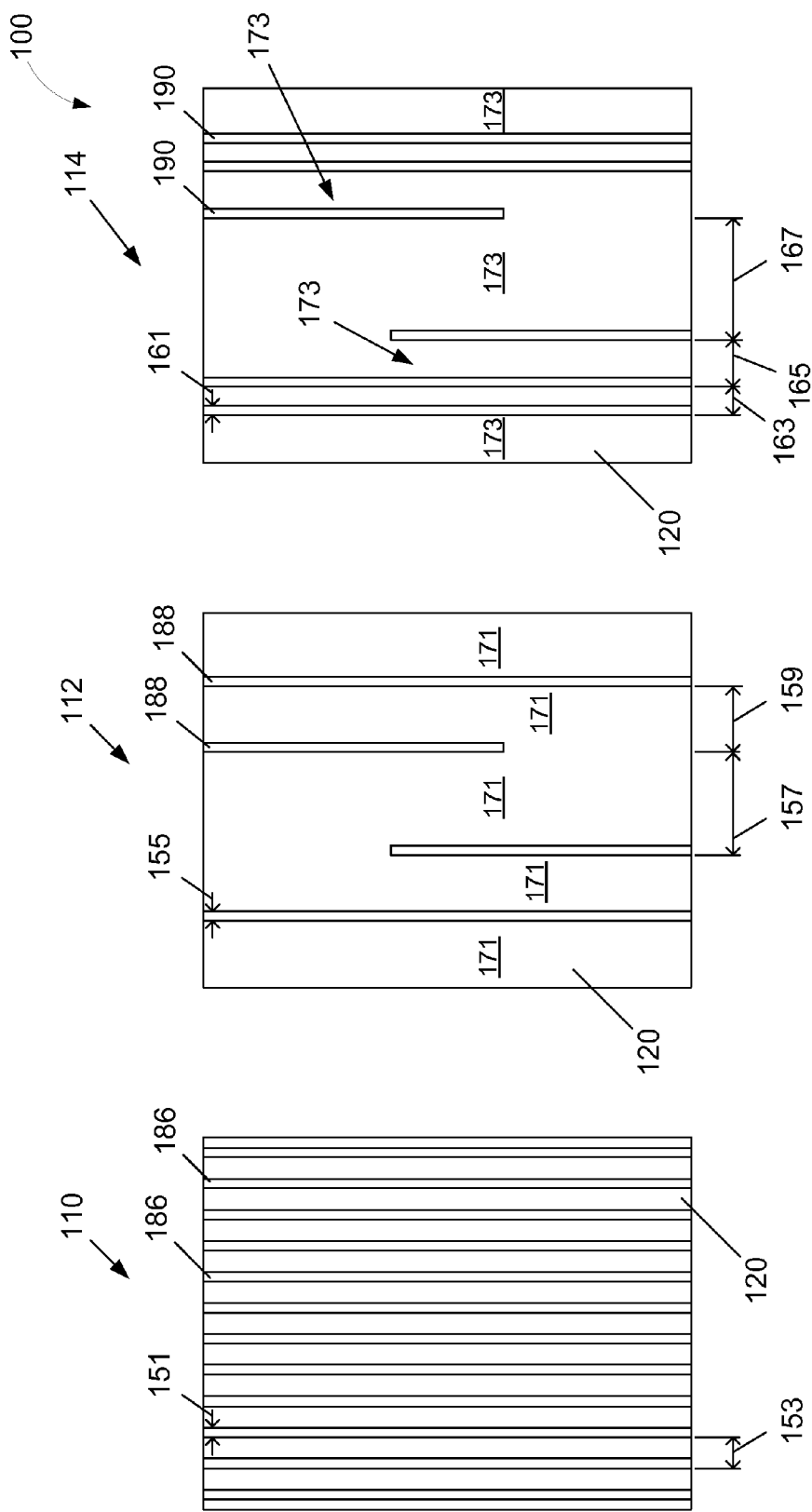

Next, as shown in FIG. 2S, one or more timed, fin-formation etching processes were performed through the final fin formation patterned etch mask 170 to transfer the pattern of the features in the final fin formation patterned etch mask 170 to the corresponding regions 110, 112, 114 of the substrate 120. FIG. 2W is a plan view of the product 100 after the fin formation etching process was performed with the final fin formation patterned etch mask 170 removed. As depicted in these drawings, three sets 186, 188, 190 of initial fins were defined in the substrate 120 in the regions 110, 112 and 114, respectively. In at least one illustrative embodiment, the set of fins 188 above the second region 112 of the substrate 120 include two different pitches 157, 159, and the set of fins 190 above the second region 114 of the substrate 120 include three different pitches 163, 165, 167. As noted above, the widths 151, 155, 161 of the three sets of fins 186, 188, 190 may be approximately the same in at least one illustrative embodiment. Unlike prior art methodologies, using the methods disclosed herein, the final fin formation patterned etch mask 170 has a pattern that, in addition to forming functional fins 186, 188, 190 in the various regions, also defines regions or spaces 171 for isolation structures in the second device region 112 and regions or spaces 173 for isolation structures in the third region 114. More specifically, as a result of the fin-formation patterning process, the region 110 still contains a "sea-of-fins" that includes both functional fins (fins that will be part of the actual FinFET devices to be formed in the region 110) as well as non-functional fins (or portions of fins) that will need to be removed so as to make room for isolation structures to be formed in the first region 110. However, using the methods disclosed herein, only functional fins are formed in the regions 112, 114, i.e., non-functional fins are not formed in the regions 112, 114. Importantly, rather than initially form a plurality of non-functional fins in the regions 112, 114, the final fin formation patterned etch mask 170 contains a pattern that avoids formation of such non-functional fins in the regions 112, 114. As a result, using the methods disclosed herein, previously formed non-functional fins do not need to be removed from the regions 112, 114, as they are never formed in those regions. This can be very advantageous in cases like, for example, where, absent use of the methods disclosed herein, a single, non-functional fin would need to be removed from a group of fins to make space for a relatively small isolation structure. As noted in the background section of this application, removal of a single fin from a previously formed sea-of-fins using traditional photolithography tools and techniques is very challenging. This is particularly important in applications where only a single non-functional fin would otherwise need to be removed between devices in advanced product application.

FIGS. 2T-2V depict the product wherein an illustrative "fin-cut" or fin removal process is performed on only the first region 110 of the substrate 120 while the second and third regions 112, 114 are masked. As previously mentioned, in at least one illustrative embodiment, the first region 110 of the substrate 120 is a region where FinFET transistors for logic circuits will be formed. The second 112 and third 114 regions of the substrate 120 are regions where different SRAM devices may be formed. As noted above, using the methods disclosed herein, a fin cut process need not be performed in the second and third regions 112, 114 to make room for isolation structures in those regions of the substrate 120 between the SRAM devices.

FIG. 2T depicts the product 100 after several process operations were performed. First, a masking layer 192 was deposited above all three regions 110, 112, 114 of the substrate 120 and perhaps subjected to an optional CMP process. Thereafter, the masking layer 192 was patterned only above the first region 110 of the substrate 120. The patterning of the masking layer 192 was accomplished by performing an etching process through a patterned etch mask (not shown), such as a patterned layer of photoresist material. The patterned portion of the masking layer exposes non-functional fins in the first region 110 that are to be removed, while the other fins formed in the substrate 120 in all three regions remain masked. The thickness of the masking layer 192 may vary depending upon the application. Because the exposed non-functional fins in the first region 110 will ultimately be cut and removed, the masking layer 192 may be referred to as a fin removal masking layer or a fin-cut mask.

Figure 2X:
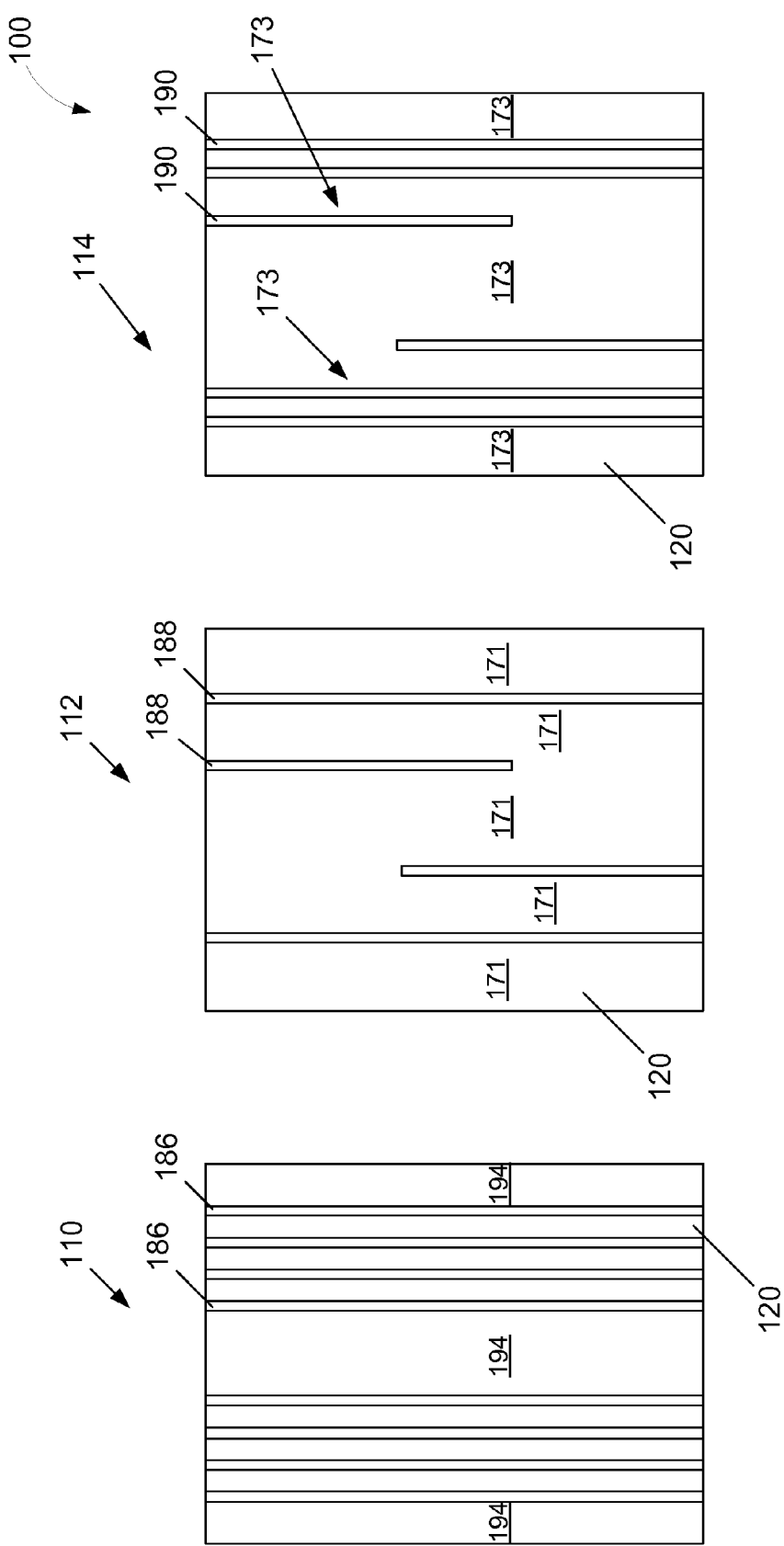

FIG. 2U depicts the product 100 after several process operations were performed. First, one or more anisotropic etching processes were performed through the patterned fin-cut masking layer 192 to remove the non-functional fins exposed by the patterned fin-cut masking layer 192 in the first region 110. As a result, relatively wide trenches 194 have been defined within the first set of fins 186 in the first region 110 only. Any number of non-functional fins can be removed depending upon the application. Thereafter, the patterned fin masking layer 192 was removed from above the substrate 120. FIG. 2X is a plan view of the product 100 after the fin formation etching process was performed with patterned fin-cut masking layer 192 and the final fin formation patterned etch mask 170 removed.

Figure 2Y:
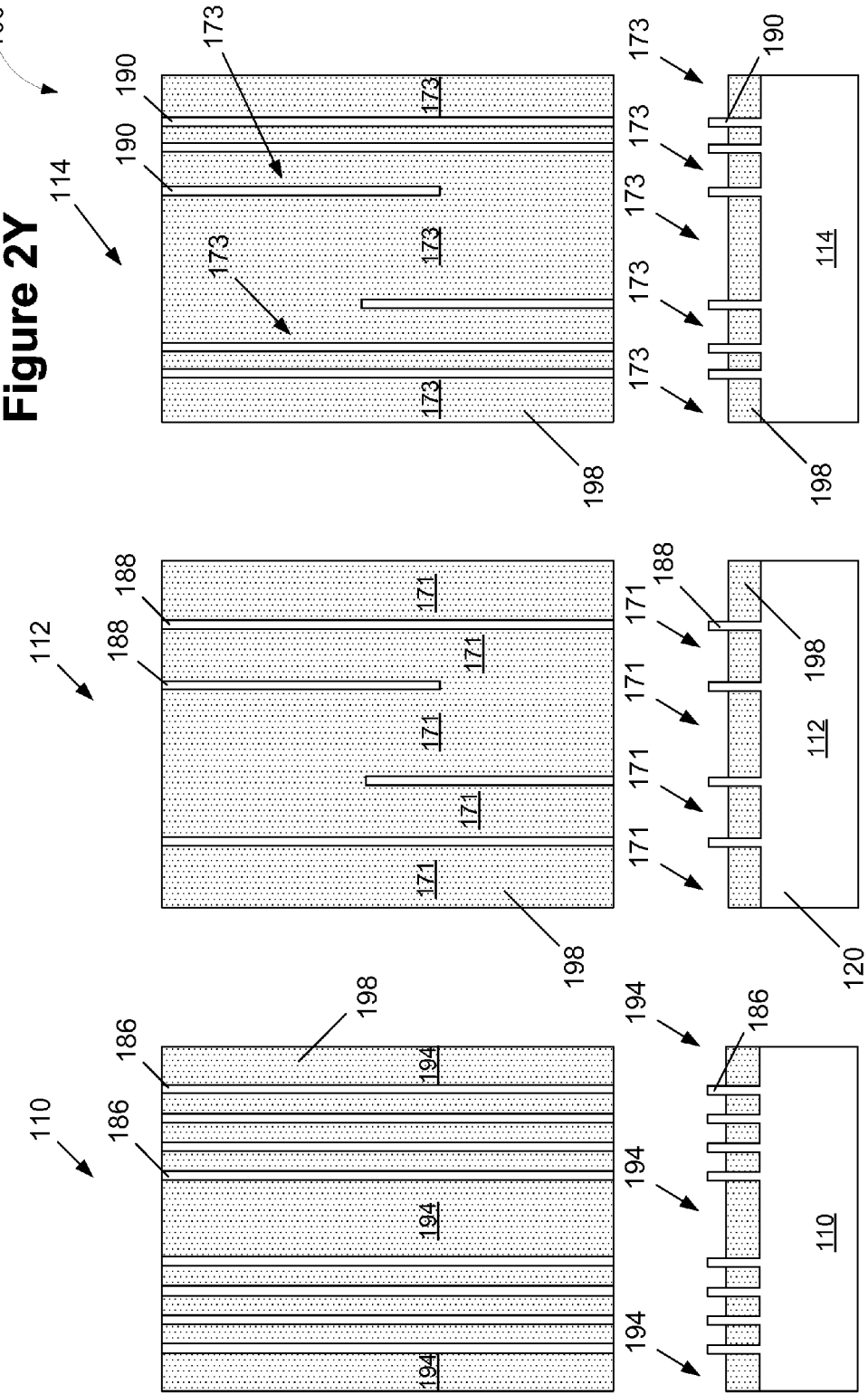

FIG. 2V depicts the product 100 after one or more etching processes were performed to remove the remaining portions of the final fin formation patterned etch mask 170. At the point of fabrication depicted in FIG. 2V, traditional manufacturing operations may be performed. More specifically, with reference to the plan and cross-sectional views shown in FIG. 2Y, a layer of insulating material 198 may be deposited above the regions 110, 112 and 114, planarized and recessed in appropriate areas to expose the functional fins in all three regions to their desired height level. Thereafter, gate structures (not shown) may be formed using either gate-first or gate-last manufacturing techniques, various source/drain and gate contact structures may be formed on the device, various metallization layers may be formed using known processing techniques, etc.

As will be appreciated by those skilled in the art after a complete reading of the present application, the fin formation process provides several advantages. Primarily, using the methods disclosed herein, there is no need to perform a fin removal (fin cut) process to remove any portion of a previously formed non-functional fin in the second 112 and third 114 regions of the substrate 120 to make room for an isolation structure because the fins that would otherwise need to be removed are, selectively, not formed in the regions 112 and 114 of the substrate 120.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   performing a fin-formation etching process through a single patterned fin-formation masking layer positioned above first and second regions of a semiconductor substrate to concurrently define:
     a first plurality of fins in said first region of said substrate;
     a second plurality of fins in said second region of said substrate; and
     a space in said substrate between two of said second plurality of fins that corresponds to a location of a first isolation region to be formed in said second region, wherein said space comprises an area that would have been occupied by at least one fin in said second plurality of fins had said second plurality of fins been formed with a uniform pitch, and wherein said space is formed without removing any fin in said second plurality of fins that was previously formed in said second region;
   forming a fin removal masking layer above said first and second regions of said substrate, a first portion of said fin removal masking layer being positioned above said first region, said first portion of said fin removal masking layer comprising at least one first opening positioned above at least a portion of each of a subset of said first plurality of fins in said first region, said fin removal masking layer masking all of said second plurality of fins in said second region and said space for said first isolation region in said second region; and
   performing at least one etching process through said at least one first opening in said fin removal masking layer to remove said portion of each of said subset of said first plurality of fins in said first region underlying said at least one first opening while masking all of said second plurality of fins and said space in said second region.

2. The method of claim 1, wherein said first plurality of fins in said first region comprise fins for FinFET devices for a logic circuit to be formed above said first region, and said fins in said second region comprise fins for FinFET devices for an SRAM device to be formed above said second region.

3. The method of claim 1, wherein a width of said fins in said first plurality of fins and a width of said fins in said second plurality of fins are substantially the same.

4. The method of claim 1, wherein said first plurality of fins in said first region are formed with a first pitch and said fins in said second plurality of fins are formed with second and third pitches, said first pitch being different from said second and third pitches.

5. The method of claim 1, further comprising forming a first type of circuit comprised of FinFET devices above said first region and forming a second type of circuit comprised of FinFET device above said second region, wherein said first and second circuits perform different functions for an integrated circuit product.

6. The method of claim 1, wherein said single patterned fin-formation masking layer is comprised of a pad oxide layer positioned on said first and second regions of said semiconductor substrate and a pad nitride layer positioned on said pad oxide layer.

7. The method of claim 1, wherein said single patterned fin-formation masking layer positioned above said first and second regions of said semiconductor substrate is formed by:
   forming a first upper patterned mandrel layer positioned above one or more layers of masking material that will ultimately comprise said single patterned fin-formation masking layer, said first upper patterned mandrel layer being patterned above said first region and non-patterned above said second region;
   forming first sidewall spacers adjacent features of said patterned portion of said first upper patterned mandrel layer positioned above said first region;
   performing a first etching process to remove said first upper patterned mandrel layer from above said first and second regions so as to define a first patterned sidewall spacer masking layer comprised of said first sidewall spacers positioned above said first region;
   while masking said second region, performing a second etching process through said first patterned sidewall spacer masking layer to define a plurality of first features of a second lower patterned mandrel layer positioned above said one or more layers of masking material, wherein said plurality of first features are positioned only above said first region;
   while masking said first region, performing a third etching process to form a plurality of second features in said second lower patterned mandrel layer, wherein said plurality of second features are positioned only above said second region;

forming second sidewall spacers adjacent first and second features of said second lower patterned mandrel layer;

performing a fourth etching process to remove said second lower patterned mandrel layer from above said first and second regions so as to define a second patterned sidewall spacer masking layer comprised of said second sidewall spacers; and performing at least one fifth etching process through said second patterned sidewall spacer masking layer to etch said one or more layers of masking material so as to define said single patterned fin-formation masking layer.

8. A method, comprising:

forming a single patterned fin-formation masking layer above first and second regions of a semiconductor substrate, wherein said single patterned fin-formation masking layer comprises a first pattern corresponding to a first plurality of fins to be formed in said first region of said substrate and a second pattern corresponding to a second plurality of fins to be formed in said second region of said substrate, said second pattern further defining a space between two fins in said second plurality of fins that corresponds to a location of a first isolation region to be formed in said second region, said space having a width greater than a spacing between fins in said first plurality of fins;

performing at least one etching process through said single patterned fin-formation masking layer to concurrently define:

said first plurality of fins in said first region of said substrate;

said second plurality of fins in said second region of said substrate; and said space in said substrate between said two of said fins in said second region;

forming a fin removal masking layer above said first and second regions of said substrate, a first portion of said fin removal masking layer being positioned above said first region, said first portion of said fin removal masking layer comprising at least one first opening positioned above at least a portion of a subset of fins in said first plurality of fin, said fin removal masking layer masking the entire second region and the space; and with said second region and the space masked, performing at least one etching process through said at least one first opening in said fin removal masking layer to remove said at least a portion of said subset of fins in said first plurality of fins underlying said at least one first opening.

9. The method of claim 8, wherein said first plurality of fins in said first region are formed with a first pitch and said second plurality of fins in said second region are formed with second and third pitches, said first pitch being different from said second and third pitches.

10. The method of claim 8, further comprising forming a first type of circuit comprised of FinFET devices above said first region and forming a second type of circuit comprised of FinFET devices above said second region, wherein said first and second circuits perform different functions for an integrated circuit product.

11. The method of claim 8, wherein said space in said second region that corresponds to a location of said first isolation region to be formed in said second region is formed without removing a previously formed one of said second plurality of fins.

12. The method of claim 8, wherein said patterned fin-formation masking layer is comprised of a pad oxide layer positioned on said first and second regions of said semiconductor substrate and a pad nitride layer positioned on said pad oxide layer.

13. A method, comprising:

forming a patterned fin-formation masking layer positioned above first and second regions of a semiconductor substrate by performing the following:

forming a first upper patterned mandrel layer positioned above one or more layers of masking material that will ultimately comprise said patterned fin-formation masking layer, said first upper patterned mandrel layer being patterned above said first region and non-patterned above said second region;

forming first sidewall spacers adjacent features of said patterned portion of said first upper patterned mandrel layer positioned above said first region;

performing a first etching process to remove said first upper patterned mandrel layer from above said first and second regions so as to define a first patterned sidewall spacer masking layer comprised of said first sidewall spacers positioned above said first region;

while masking said second region, performing a second etching process through said first patterned sidewall spacer masking layer to define a plurality of first features of a second lower patterned mandrel layer positioned above said one or more layers of masking material, wherein said plurality of first features are positioned only above said first region;

while masking said first region, performing a third etching process to form a plurality of second features in said second lower patterned mandrel layer, wherein said plurality of second features are positioned only above said second region;

forming second sidewall spacers adjacent first and second features of said second lower patterned mandrel layer;

performing a fourth etching process to remove said second lower patterned mandrel layer from above said first and second regions so as to define a second patterned sidewall spacer masking layer comprised of said second sidewall spacers; and performing at least one fifth etching process through said second patterned sidewall spacer masking layer to etch said one or more layers of masking material so as to define said patterned fin-formation masking layer;

performing a fin-formation etching process through the patterned fin-formation masking layer to define a first plurality of functional fins and non-functional fins in said first region of said substrate, a second plurality of only functional fins in said second region of said substrate, and a space in said substrate between two of said only functional in said second region that corresponds to location of a first isolation region to be formed in said second region;

forming a fin removal masking layer above said first and second regions of said substrate, a first portion of said fin removal masking layer being positioned above said first region, said first portion of said fin removal masking layer comprising at least one first opening positioned above at least a portion of at least one of said non-functional fins of said first plurality of fins, said fin removal masking layer masking all of said second plurality of only functional in said second region and said space for said first isolation region; and performing at least one etching process through said at least one first opening in said fin removal masking layer to remove said portion of said at least one of said non-functional fins of said first plurality of fins underlying said at least one first opening while masking all of said second plurality of only functional fins in said second region.

14. A method, comprising:
performing a common fin-formation etching process through a single patterned fin-formation masking layer positioned above first and second regions of a semiconductor substrate, wherein said performance of said common fin-formation etching process results in the concurrent definition of:
- a first plurality of fins in said first region of said substrate;
- a second plurality fins in said second region of said substrate; and
- a space in said substrate between two of said second plurality of fins, wherein the space corresponds to a location of a first isolation region to be formed in said second region, wherein said space is formed in said second region without removing any of said second plurality of fins that was previously formed in said second region;

forming a patterned fin removal masking layer above the substrate that masks said entire second region and said space and exposes at least a portion of a subset of said first plurality of fins in said first region; and performing at least one etching process through said patterned fin removal masking layer to remove said exposed portion of said subset of said first plurality of fins in said first region.

* * * * *